Figure 1:
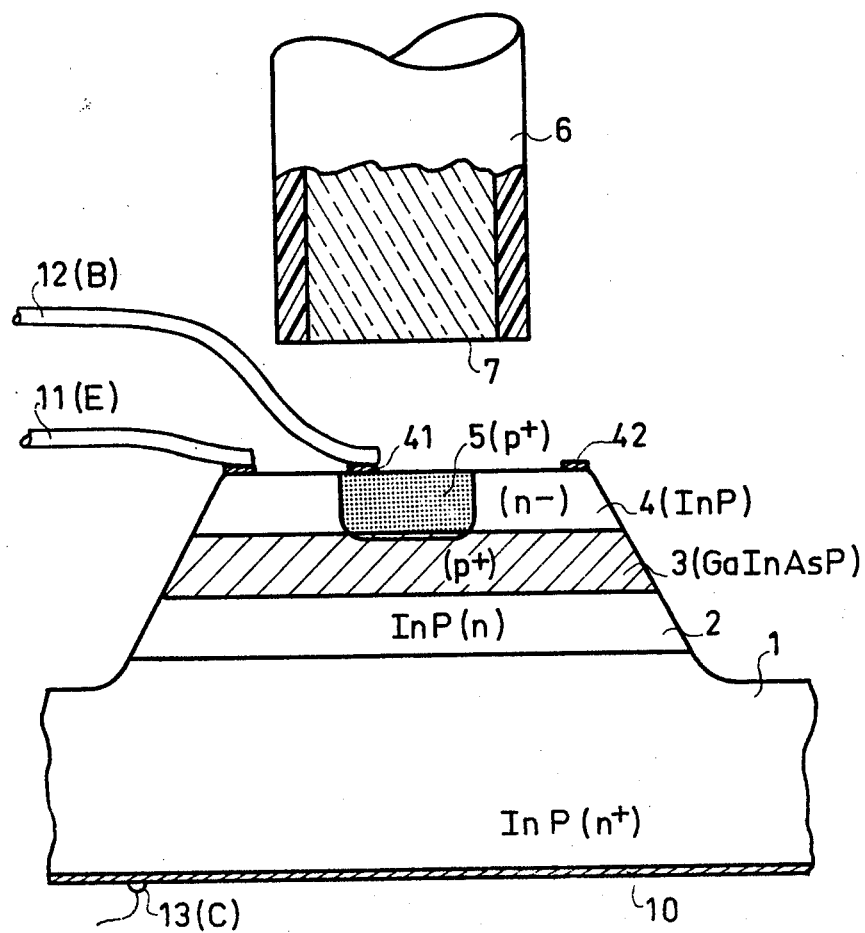

United States Patent [19]

Poulain et al.

[11] Patent Number: 4,485,391
[45] Date of Patent: Nov. 27, 1984

[54] LIGHT EMITTING AND RECEIVING TRANSISTOR FOR OPERATION IN ALTERNATE SEQUENCE IN AN OPTICAL-FIBER TELECOMMUNICATIONS SYSTEMS

[75] Inventors: Pierre Poulain; Baudouin de Cremoux; Pierre Hirtz, all of Paris, France

[73] Assignee: Thomson-CSF, Paris, France

[21] Appl. No.: 315,862

[22] Filed: Oct. 28, 1981

[30] Foreign Application Priority Data

Oct. 28, 1980 [FR] France ............................... 80 23015

[51] Int. Cl.³ ................... H01L 29/161; H01L 31/12; H01L 27/14; H01L 27/02
[52] U.S. Cl. ......................................... 357/19; 357/16; 357/17; 357/30; 357/46; 350/96.20
[58] Field of Search ...................... 357/16, 17, 19, 30, 357/46, 34; 350/96.17, 96.20

[56] References Cited

U.S. PATENT DOCUMENTS

| | | | |
|---|---|---|---|
| 4,160,253 | 7/1979 | Dawson et al. | 357/19 |
| 4,176,367 | 11/1979 | Nematsu | 357/16 |
| 4,213,138 | 7/1980 | Campbell et al. | 357/17 |
| 4,218,692 | 8/1980 | de Cremoux | 357/16 |
| 4,388,633 | 6/1983 | Vasudev | 357/17 |

FOREIGN PATENT DOCUMENTS

| | | | |
|---|---|---|---|
| 0012585 | of 0000 | European Pat. Off. | 357/30 |
| 53-116792 | 10/1978 | Japan | 357/19 |
| 55-98880 | 7/1980 | Japan | 357/19 |

OTHER PUBLICATIONS

S. Sakai et al., "Integrated light emitters and photodetectors for dual-channel optical communication", Sixth European Conference on Optical Communication, York, England, (Sep. 1980) pp. 16-19.
C. Lanza et al., "Image Converter with built-in gain", IBM Technical Disclosure Bulletin, vol. 16 (1973), pp. 842-843.
IBM Technical Disclosure Bulletin, vol. 12, No. 6, 11/69, pp. 869-870, New York, Prusik et al.: "Double-Junction optical Semiconductor".
IBM Technical Disclosure Bulletin, vol. 12, No. 9, 2/70, p. 1486, New York, Woodall et al.: "Differential Phototransducer".
Applied Physics Letters, vol. 34, No. 6, 3/79, pp. 401-402, New York, Campbell et al: "Dual-Wave-Length Demultiplexing InG=AsP Photodiode".

Primary Examiner—Andrew J. James
Assistant Examiner—J. Carroll
Attorney, Agent, or Firm—Oblon, Fisher, Spivak, McClelland & Maier

[57] ABSTRACT

A phototransistor which is capable of operating alternately in the emission mode and in the reception mode can be coupled under favorable conditions to an optical fiber in a telecommunications system. An active layer constitutes the base of the transistor and forms a heterojunction with two layers of opposite conductivity type which constitute the emitter and collector of the transistor. The base contact is formed by a heavily doped region of the same conductivity type as the active layer and defines the useful zone of photon coupling between the optoelectronic component and the entrance face or exit face of the optical fiber.

6 Claims, 4 Drawing Figures

LIGHT EMITTING AND RECEIVING TRANSISTOR FOR OPERATION IN ALTERNATE SEQUENCE IN AN OPTICAL-FIBER TELECOMMUNICATIONS SYSTEMS

This invention relates to optoelectronic components which are capable of operating alternately in the emission mode and in the reception mode and can be coupled under favorable conditions to an optical fiber, especially a fiber of the type employed in telecommunications.

The components employed up to the present time comprise double-heterostructure diodes which operate both as electroluminescent diodes with forward biasing of the semiconductor junction and as photodiodes with reverse biasing in which provision may be made for amplification gain.

Diode components of this type exhibit relatively inferior performances which result from a compromise between the operating conditions in the emission mode and in the reception mode. In structures designed to provide both an emitter function and a receiver function, the following disadvantages are observed:
- relatively low efficiency which does not exceed 20% (at reception in energy);
- response time of the emitter approximately ten times longer than that of the same structure when used as a receiver;
- avalanche noise which limits the amplification gain to 10.

The invention tends to overcome these disadvantages by making use of a heterostructure comprising a phototransistor.

The transistor according to the invention is of the type comprising a semiconductor substrate and a series of semiconductor layers including at least one active layer located between two heterojunctions.

The essential feature of the transistor lies in the fact that the layer which is farthest away from the substrate and is intended to be coupled to an entrance face or to an exit face of an optical fiber has a heavily doped region which is of the same conductivity type as the active layer, which occupies only part of said layer and is connected to the base electrode of the transistor. The active layer performs the function of base of said transistor, the layer which is farthest away from the substrate performs the function of emitter and the substrate performs the function of collector.

Figure 2:
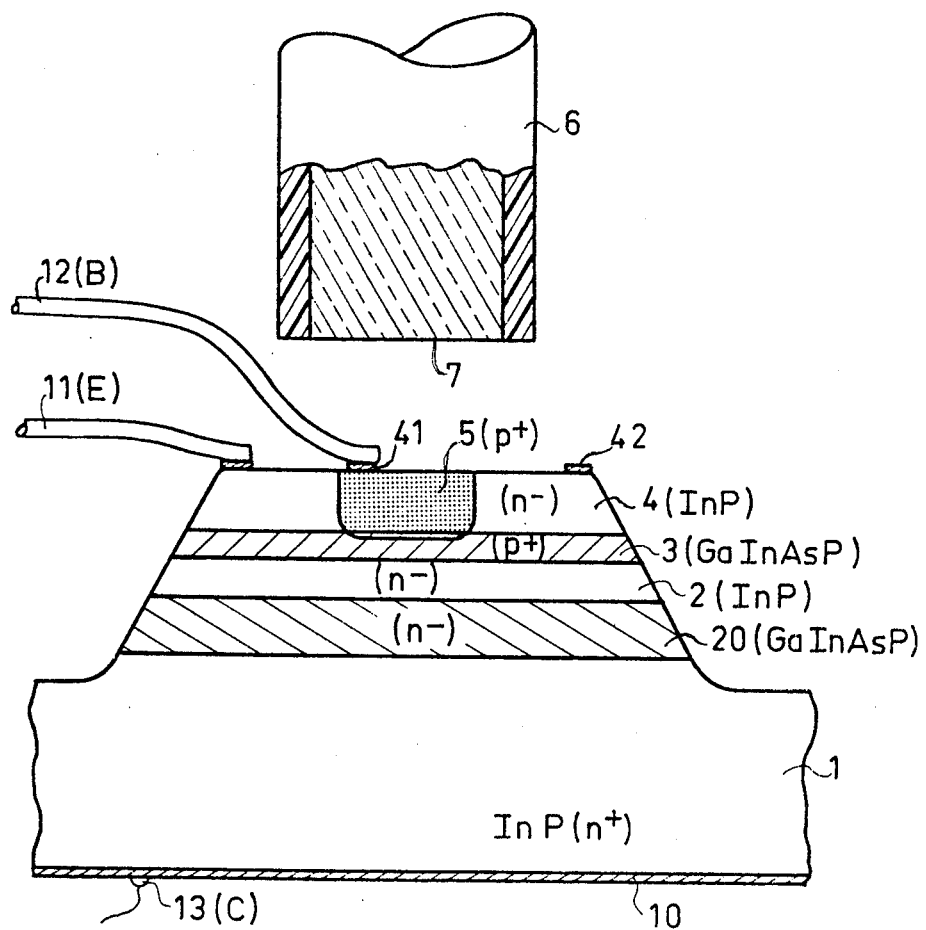
Figure 3:
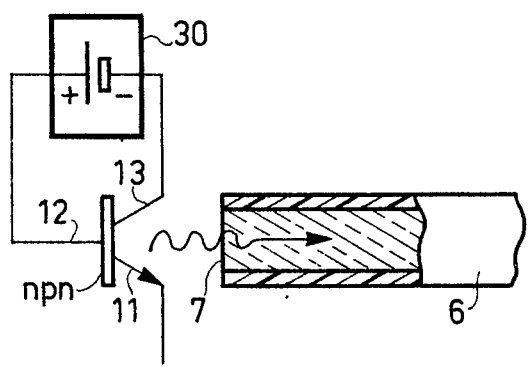
Figure 4:
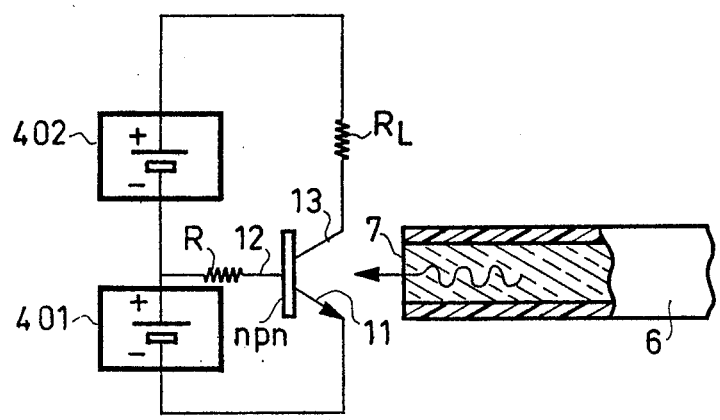

These and other features of the invention will be more apparent to those skilled in the art upon consideration of the following description and accompanying drawings, wherein:

FIG. 1 illustrates one embodiment of the invention;
FIG. 2 illustrates an alternative embodiment of the invention;
FIGS. 3 and 4 illustrate the modes of electrical connection of the transistor according to the invention, respectively for emission and reception.

The transistor according to the invention can be constructed by employing semiconductor materials:
either of the ternary type: Ga, Al, As;
or of the quaternary type: Ga, In, As, P.

The substrate can be of n or p type and the phototransistor can be of the npn or pnp type.

The embodiments of FIGS. 1 and 2 are described in the case of an npn transistor in the quaternary system.

There is shown in FIG. 1 a substrate 1 of $n^+$ doped indium phosphide (concentration higher than or equal to $10^{17}$ cm$^{-3}$). Semiconductor layers 2, 3 and 4 have been deposited on said substrate and a mesa of circular shape has been formed by etching away all the material down to the substrate 1 inclusively.

The layer 2 is of n-doped indium phosphide with a lower concentration than that of the substrate, namely $10^{15}$ to $10^{16}$ cm$^{-3}$. The thickness of this layer can vary between 2 (case of maximum doping) and 20 microns (case of minimum doping). This thickness is calculated as a function of the concentration and supply voltages adopted for producing electric fields which are capable of subjecting the entire layer to a space-charge regime.

The layer 3 is of phosphorus, indium and gallium arsenide in accordance with the general formula:

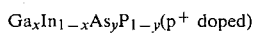
$$Ga_xIn_{1-x}As_yP_{1-y}(p^+ \text{ doped})$$

with $0<x<0.47$
and $0<y<1$

The parameters x and y are chosen within the intervals given above so as to satisfy the relation:

$$x = \frac{0.19\, y}{0.42 - 0.013\, y}$$

In fact, this relation is the condition to be fulfilled in order to ensure that the monocrystal lattice structure is compatible with that of the substrate 1 and of the layer 2. In practice, it is sufficient to satisfy said relation to within a tolerance of 1%.

$p^+$ doping is of the order of $10^{18}$ cm$^{-3}$. The thickness is within the range of 1 to 2 microns.

By way of example, in the case of a wavelength of the light emitted by the layer 3 which is equal to 1.3 micron, the following values are chosen:
x=0.22
y=0.5.

The layer 4 is of $n^-$ type InP (concentration of $10^{16}$ cm$^{-3}$) having a thickness of 1 to 3 microns.

A substantially cylindrical region 5 is formed at the center of the circular mesa structure. Said region has a high $p^+$ dopant concentration (higher than $10^{17}$ cm$^{-3}$) by resorting to the use of a conventional method of localized implantation or diffusion of p-type impurities. In particular, in the case of diffusion, masking is necessary in order to make the layer 4 impermeable to penetration of diffusion impurities outside the selected region.

Ohmic contacts 41 and 42 are then formed. The contact 42 is annular and located at the periphery of the free surface of the layer 4. The contact 41 is formed at the surface of the region 5. Leads 11(E) and 12(B) are bonded respectively to the contacts 42 and 41 in order to serve as emitter and base connections. A collector lead 13(C) is bonded to a metallization layer 10 (said layer having previously been formed) on that face of the substrate which is remote from the layers 1 to 4.

The accompanying drawings also provide fragmentary views of an optical fiber 6, the core of which has a flat face 7.

The surface area of the region 5 must be smaller than the area of the flat entrance face of the fiber in order to ensure that the light emission produced by the layer 3 in that region which is located beneath the region 5 essentially penetrates into the core of the fiber. Under these conditions, operation in the emission mode is conducive to good transmission. In regard to reception conditions, it is desirable to ensure that the surface area of the region 5 is of the same order of magnitude as the entrance face of the fiber.

The operation of the transistor thus formed takes place as follows:

If the pn junction of the npn transistor is biased in the forward direction (FIG. 3) by applying between the leads 12 and 13 a direct-current voltage produced by a generator 30, there is thus observed an emission of photons, the origin of which is localized in that portion of the layer 3 which is nearest the region 5. The lead 11 (emitter connection) is allowed to dangle and its potential remains "floating". In fact, only the $p^+n$ heterojunction between layers 3 and 2 performs the active function in the operating condition of an electroluminescent diode. A particular feature of this structure lies in localization of the hole current derived from the region 5 in that portion of the layer 3 which is located between said region and the layer 2. This in turn produces localization of the photons produced when the holes encounter the electrons derived from the layer 2. The electroluminescence phenomenon itself can be attributed to the relative narrowness of the forbidden band of the material of the layer 3.

There is shown in FIG. 4 a method of connection which is different from that of FIG. 3 and corresponds to the case of operation as a phototransistor. A direct-current voltage source 401 has its negative pole connected to the emitter 11 and its positive pole connected to the base 12 through a resistor R. A direct-current voltage source 402 has its negative pole connected to the positive pole of the source 401 and the positive pole of said source is connected to the collector 13 through a receiver $R_L$. The photons absorbed in the layer 3 give rise to pairs of electrons and of holes which generate the primary current. This current is amplified by transistor effect, thus giving rise to a collector current which flows through the receiver $R_L$ and this latter performs the function of a photon current detector.

FIG. 2 illustrates an alternative form of the embodiment shown in FIG. 1, the same reference numerals being employed to designate the same elements. The semi-conducting structure of this variant differs from the proceding embodiment in the presence of a complementary layer 20 and in a different thickness of the layer 3 which is of much smaller value (0.2 to 0.5 micron).

The layer 20 is a photon-absorption layer in which the forbidden band is purposely narrower than that of the layer 3. To this end, the following composition has been chosen for the layer 20:

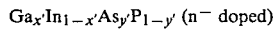
$Ga_{x'}In_{1-x'}As_{y'}P_{1-y'}$ ($n^-$ doped)

with, for example:
x'=0.26
y'=0.60
and, more generally, x' and y' comply with the same relations as x and y while having respectively higher values than the corresponding parameters of the layer 3.

The dopant has an $n^-$ atom concentration of $10^{15}$ to $10^{16}$ cm$^{-3}$.

The layer 2 has the same composition and doping as in the structure of FIG. 1 but is of appreciably smaller thickness, namely within the range of 0.1 to 0.3 micron.

The remainder of the device is the same in both embodiments. The operation is similar and the utilization circuits are identical. The only difference lies in the separation of the photon emission and detection layers in the second embodiment.

In the case of utilization of materials of the ternary type (Ga, Al, As), the compositions would be as follows:

(1) In the embodiment of FIG. 1:
  Substrate 1: GaAs
  Layer 2: $Ga_{1-x}Al_xAs$ with $0.2 \leq x \leq 0.4$
  Layer 3: similar formula with $0 \leq x \leq 0.1$
  Layer 4: same composition as layer 2 and same conductivity type.

(2) In the embodiment of FIG. 2:
  Substrate 1: GaAs
  Layer 20: GaAs
  Layer 2: $Ga_{1-x}Al_xAs$ with $0.2 \leq x \leq 0.4$
  Layer 3: similar formula with $0.02 \leq x \leq 0.1$ and preferably: x=0.05

Layer 4: same composition as layer 2.

The invention applies to transistors of the reverse-biased type, namely pnp transistors instead of the npn type of the foregoing description provided that the polarities of the voltages applied to the devices are changed.

What is claimed is:

1. A light emitting and receiving transistor comprising:
  a semiconductor substrate and plural semiconductor layers formed in series on said substrate, including,
  a first layer farthest away from said substrate adapted to be coupled to an entrance face or an exit face of an optical fiber, said first layer having a predetermined wide bandgap composition and being of a first conductivity type,
  a second layer having a predetermined narrow bandgap composition and being of a second conductivity type opposite that of said first layer formed adjacent said first layer, and
  a third layer having a predetermined wide bandgap composition and being of said first conductivity type formed adjacent said second layer;
  said second layer being an active layer and having an interface with said first layer forming a first pn heterojunction and an interface with said third layer forming a second pn heterojunction;
  said first layer having formed in only a part thereof a heavily doped region of the second conductivity type extending through said first layer to said second layer;
  wherein said substrate and said layers form a transistor having base, emitter and collector functions, the transistor base function being performed by said active layer while the emitter function is performed by the first layer and the collector function is performed by said substrate, said active layer, said third layer and said second heterojunction forming a light emission region; and
  base, emitter, and collector electrodes respectively connected to said heavily doped region formed in said first layer, said first layer, and said substrate.

2. A transistor according to claim 1 wherein the substrate comprises heavily doped InP of said first conductivity type, said third layer comprises less heavily doped InP than the substrate in said first conductivity type, the second layer or active layer comprises a material of said second conductivity type corresponding to the formula:

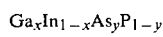
$Ga_xIn_{1-x}As_yP_{1-y}$ with:

$0 < x < 0.47$
$0 < y < 1$ where x and y are related to each other in such a manner as to ensure that the crystal lattices of the substrate and of the different layers are compatible, the first layer which is farthest away from the substrate being of InP of the same conductivity type as the third layer.

3. A transistor according to claim 1 wherein the substrate comprises heavily doped GaAs of said first conductivity type, said third layer comprises $Ga_{1-x}Al_xAs$ (with $0.2 \leq x \leq 0.4$) which is less heavily doped than the substrate in the said first conductivity type, said active layer comprises a material of said second conductivity type corresponding to the formula:

$$Ga_{1-x}Al_xAs$$

with: $0 \leq x < 0.1$ the first layer having the same composition and the same conductivity type as the third layer.

4. A transistor according to claim 1, comprising:
the substrate comprising heavily doped GaAs of said first conductivity type,
a fourth layer comprising less heavily doped GaAs than the substrate disposed between said substrate and said third layer, said fourth layer formed of said first conductivity type,
said third layer comprising a material of the first conductivity type and corresponding to the formula:

$$Ga_{1-x}Al_xAs$$

with: $0.2 \leq x \leq 0.4$ said active layer comprising a material of said second conductivity type and having a composition which is similar to that of the third layer, with:

$0.02 \leq x \leq 0.1$, and said first layer having the same composition and the same conductivity type as the third layer.

5. A transistor according to claim 1, wherein said transistor has a mesa structure of circular shape, the heavily doped region being implanted or diffused at the center of said structure so as to have a cylindrical shape.

6. A transistor according to claim 1, comprising:
a fourth layer disposed between said substrate and said third layer, said fourth layer formed of said first conductivity type,
wherein the substrate comprises heavily doped InP of said first conductivity type, said fourth layer comprises a less heavily doped material than the substrate and corresponds to the formula:

$Ga_{x'}In_{1-y'}As_{y'}P_{1-y'}$
with:
$0 < x' < 0.47$
$0 < y' < 1;$ said second layer corresponding to the formula:

$Ga_{x'''}In_{1-y'''}As_{y'''}P_{1-y''}$ wherein
$x'' < x'$
$y'' < y'$ the parameters (x', y') and (x'', y'') being chosen so that the crystal lattices of the substrate and of the respective layers are compatible, said first layer having the same composition and the same conductivity type as the third layer.

* * * * *